United States Patent
Slater, Jr. et al.

(10) Patent No.: US 6,946,682 B2
(45) Date of Patent: *Sep. 20, 2005

(54) ROBUST GROUP III LIGHT EMITTING DIODE FOR HIGH RELIABILITY IN STANDARD PACKAGING APPLICATIONS

(75) Inventors: David B. Slater, Jr., Durham, NC (US); Gerald H. Negley, Hillsborough, NC (US); John A. Edmond, Cary, NC (US)

(73) Assignee: Cree, Inc., Durham, NC (US)

( * ) Notice: Subject to any disclaimer, the term of this patent is extended or adjusted under 35 U.S.C. 154(b) by 164 days.

This patent is subject to a terminal disclaimer.

(21) Appl. No.: 10/393,598

(22) Filed: Mar. 21, 2003

(65) Prior Publication Data

US 2004/0026707 A1 Feb. 12, 2004

Related U.S. Application Data

(63) Continuation of application No. 08/920,409, filed on Aug. 29, 1997, now abandoned.

(51) Int. Cl.[7] ............................................. H01L 27/15
(52) U.S. Cl. ............................. 257/79; 257/13; 257/81; 257/85; 257/91; 257/93; 257/98; 257/99; 257/103
(58) Field of Search .................. 257/79–103

(56) References Cited

U.S. PATENT DOCUMENTS

| | | | |
|---|---|---|---|
| 4,860,069 A | * | 8/1989 | Yamazaki .................... 257/13 |
| 5,113,233 A | | 5/1992 | Kitagawa et al. |
| RE34,861 E | | 2/1995 | Davis et al. |
| 5,393,993 A | | 2/1995 | Edmond et al. |
| 5,404,282 A | * | 4/1995 | Klinke et al. ................ 362/249 |
| 5,416,342 A | * | 5/1995 | Edmond et al. ............... 257/76 |
| 5,523,589 A | * | 6/1996 | Edmond et al. ............... 257/77 |
| 5,583,351 A | | 12/1996 | Brown et al. |
| 5,585,648 A | | 12/1996 | Tischler |
| 5,592,501 A | | 1/1997 | Edmond et al. |
| 5,616,937 A | | 4/1997 | Kitagawa et al. |
| 5,652,434 A | | 7/1997 | Nakamura et al. |
| 5,708,280 A | | 1/1998 | Lebby et al. |
| 5,739,554 A | * | 4/1998 | Edmond et al. ............ 257/103 |
| 5,767,581 A | | 6/1998 | Nakamura et al. |
| 5,813,752 A | | 9/1998 | Singer et al. |

FOREIGN PATENT DOCUMENTS

| | | |
|---|---|---|
| EP | 0357458 A2 | 3/1980 |
| EP | 0404565 A1 | 12/1990 |
| EP | 0622858 A2 | 11/1994 |
| WO | WO 96/24167 A1 | 8/1996 |

OTHER PUBLICATIONS

Ishikawa, Hidenorl, et al.: "Effects of Surface Treatments and Metal Work Functions on Electrical Properties at p–GaN/Metal Interfaces," J.Appl.Phys., vol. 81, No. 3, Feb. 1, 1997, pp. 1315–1322.

* cited by examiner

*Primary Examiner*—Long Pham
*Assistant Examiner*—Wai-Sing Louie
(74) *Attorney, Agent, or Firm*—Summa & Allan, P.A.

(57) ABSTRACT

A physically robust light emitting diode is disclosed that offers high-reliability in standard packaging and that will withstand high temperature and high humidity conditions. The diode comprises a Group III nitride heterojunction diode with a p-type Group III nitride contact layer, an ohmic contact to the p-type contact layer, and a passivation layer on the ohmic contact. The diode is characterized in that it will emit at at least 50% of its original optical power and remain substantially unchanged in operating voltage after operating for at least 1000 hours at 10 miliamps in the environment of 85% relative humidity at a temperature of 85 C. An LED lamp incorporating the diode is also disclosed.

23 Claims, 6 Drawing Sheets

ROBUST GROUP III LIGHT EMITTING DIODE FOR HIGH RELIABILITY IN STANDARD PACKAGING APPLICATIONS

CROSS-REFERENCE TO RELATED APPLICATION

This application is a continuation of U.S. application Ser. No. 08/920,409, filed Aug. 29, 1997, now abandoned.

BACKGROUND OF THE INVENTION

A light emitting diode is a p-n junction device that converts electrical energy into optical radiation. In particular, under proper forward-biased conditions LED's emit external spontaneous radiation in the ultraviolet, visible, and infra-red regions of the electromagnetic spectrum.

As known to those familiar with the visible and near-visible portions of the electromagnetic spectrum and their characteristics, shorter wavelengths of light (such as blue and ultraviolet) represent higher frequency, higher energy transitions, and longer wavelengths (such as red and infra-red) represent lower frequency, lower energy transitions.

Thus, with respect to light emitting diodes, the particular portion of the spectrum in which they emit—i.e., their color—is based upon the energy of the transitions that create the emissions. In turn, the energy of the transitions is determined to a great extent by the bandgap of the particular material. Thus, in order for a light emitting diode to emit in the blue or ultraviolet portions of the spectrum, the bandgap of the semiconductor material must be large enough (wide enough) to support a transition with sufficient energy to produce blue or ultraviolet light.

Accordingly, the candidate materials for light emitting diodes in the blue and ultraviolet regions of the spectrum are limited to certain wide bandgap materials such as diamond, silicon carbide (SiC) and Group III nitrides; e.g., binary, ternary and tertiary nitrides formed from the Group III elements of the periodic table such as gallium nitride (GaN), indium gallium nitride (InGaN), and aluminum gallium nitride (AlGaN).

Recent development work in the field of blue LEDs has focused more closely on the Group III nitrides because of their wide bandgaps and their characteristics as direct, rather than indirect, transition materials. As is well understood by those of ordinary skill in this art, a direct band gap material tends to offer higher efficiency because its energy conversion is predominantly in the form of light (a photon) rather than partially as light and partially as vibrational energy (a phonon).

A more extensive discussion of the structure, quantum mechanics, and operation of LEDs and other photonic devices is set forth in Sze, *Physics of Semiconductor Materials,* 2d Edition (1981, John Wiley & Sons, Inc). These principles are generally well understood in this art and will not be repeated herein other than as necessary to explain and support the claimed invention.

In a very general sense, a light emitting diode generally includes two layers of opposite conductivity type material which together form a p-n junction. These materials are typically in the form of epitaxial layers on a substrate. Most desirably an ohmic contact is made to the substrate and to the top epitaxial layer to form a "vertical" device for optimum efficiency in packaging.

In this regard, an LED is often packaged for end use in the form of an LED lamp. A typical LED lamp includes an LED chip (or "die", the term "chip" often being used to describe an integrated circuit rather than an LED) and a plastic (or sometimes glass) lens. For some LEDs the lens is colored to serve as an optical filter and to enhance contrast, but for blue LEDs the lens is preferably colorless so as to avoid interference with the desired blue emission. Typical lamp configurations are well known to those of ordinary skill in this art and are set forth for example, in Sze, *supra* at pages 697–700. Typically, once an LED) chip is packaged as a lamp, it can be used for a variety of applications such as indicators and alpha numeric displays.

There are some specific considerations, however, that apply to certain types of devices. For example, Group III nitride devices are typically formed on either sapphire or silicon carbide substrates. Silicon carbide substrates are preferred in many circumstances because SiC can be conductively doped. Thus, an SiC substrate can form the basis for a "vertical" device with "top" and "bottom" ohmic contacts. In contrast, the insulating character of sapphire prevents its use in vertical devices.

In turn, n-type SiC substrates tend to be preferred over p-type substrates because n-type SiC is generally more conductive and transmits more light.

As a result a Group III nitride device on an SiC substrate typically includes an n-type substrate, an n-type buffer layer (or combination of layers), an n-type epitaxial layer, and the p-type layer (e.g., GaN) on the "top" of the device.

The development, commercial introduction, and use of such Group III nitride LEDs is relatively recent. Accordingly, it has been determined that in commercial use (the term "commercial" generally refers, but is not limited, to a product that is manufactured and sold on an inventory basis), they suffer from particular types of physical and chemical breakdown that eventually degrade the electronic performance of the devices. More specifically, it has become apparent that under normal environmental conditions, in which LED lamps are operated at or above room temperature and under normal conditions of humidity and other environmental factors, the ohmic contacts and associated passivation layers tend to interact with one another resulting in degraded optical and electrical performance. The degradation problem appears to be particularly acute in those devices that include p-type GaN as their top layer, with, an ohmic contact to that p-type layer.

Thus, in some commercial versions of blue LEDs made from Group III nitrides, the packaging itself is very specific and robust because the LED chip being packaged is relatively fragile even under normal environmental circumstances. For example, in the NSPG630S device from Nichia Chemical Industries of Tokushima, Japan, the p-type layer, the ohmic contact, and the passivation layer are coated with a flexible transparent polymeric material and then encapsulated in a hard resin such as an epoxy-based polymer.

For instance, in European Published Application No. 0 622 858 ("Gallium nitride based III-V group compound semiconductor device and method of producing the same"), Nakamura et al. report that, "(t)he p-electrode (to the p-type gallium nitride) may be formed of any suitable metallic material" (page 6, line 7). Nakamura goes on to list eight candidate metals (Au, Ni, Pt, Al, Sn, In, Cr, and Ti) and names a nickel and gold combination (page 6, lines 10–12 and 33–35) as the preferred selection. Furthermore, in selecting a passivation layer ("protective film"), Nakamura offers some merely general criteria ("The material forming the protective film is not particularly limited, as long as it is transparent, and electrically insulative." Page 9, lines 31–32). Nakamura then goes on to list four candidate materials: silicon dioxide ($SiO_2$), titanium oxide (TiO), aluminum oxide ($Al_2O_3$), and Silicon nitride ($Si_3N_4$).

The more widespread introduction of GaN-based LEDs has demonstrated, however, that such a general selection of materials is inappropriate, and that the resulting LEDs degrade much more rapidly than is otherwise appropriate for useful commercial devices. In particular, LEDs that: (1) include a top epitaxial layer of p-type GaN; (2) use ohmic contacts formed from certain metals (or their combinations) such as titanium and gold ("Ti/Au"); and (3) use silicon dioxide ($SiO_2$) as the passivation layer, tend to exhibit more rapid degradation than is commercially acceptable. More specifically, it appears that the water-permeability of $SiO_2$ allows sufficient moisture to reach the p-electrode to degrade the electrode and eventually the entire device relatively quickly.

As noted above, sophisticated packaging offers one option for protecting a relatively fragile die structure. In order to obtain their fullest commercial potential, however, blue LEDs formed from Group III nitrides must be manufactured in such a manner that they can be incorporated in more common lamp packages analogous to the lamp packages used for materials that are less esoteric than Group III nitrides.

Accordingly, a need exists for a robust LED chip that can be packaged in normal fashion and yet which will successfully withstand both normal and elevated temperature and humidity conditions, for a time period sufficient to make the devices useful in a wide variety of commercial applications.

OBJECT AND SUMMARY OF THE INVENTION

Therefore, it is an object of the present invention to provide a physically robust light emitting diode that offers high reliability in standard packaging and that will withstand high temperature and high humidity conditions.

The invention meets this object with a diode that comprises a Group III heterojunction diode with a p-type Group III nitride (and preferably gallium nitride) contact layer, an ohmic contact to the p-type contact layer, and a passivation layer on the ohmic contact, characterized in that the diode will emit at least 50% of its original optical power and remain substantially unchanged an operating voltage after operating for at least 1000 hours at 10 milliamps in an environment of 85% relative humidity at a temperature of 85° C.

In another aspect, the invention comprises an LED lamp formed of the light emitting diode and a plastic lens.

These and other objects and advantages of the invention will become more readily apparent upon consideration of the following detailed description taken in conjunction with the drawings in which:

DETAILED DESCRIPTION

The present invention is a physically robust light emitting diode that offers high reliability in standard packaging and will withstand high temperature and high humidity conditions.

As noted in the background, ohmic contacts must be protected from physical, mechanical, environmental and packaging stresses to prevent degradation of Group III nitride LEDs.

Figure 1:
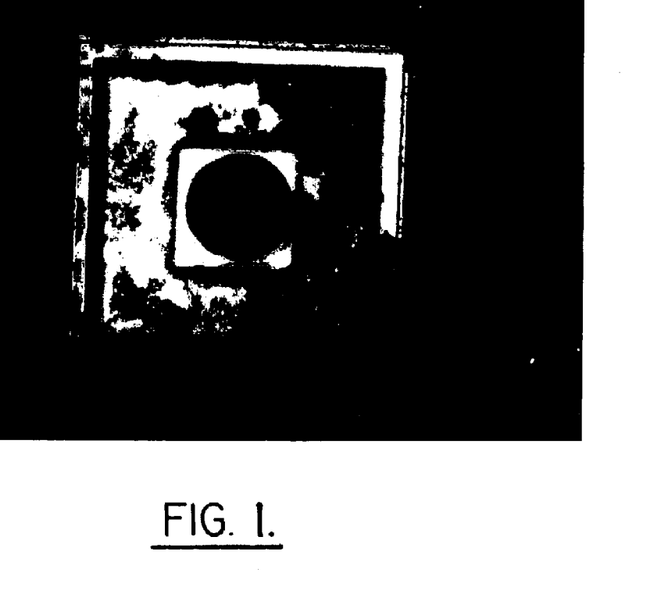
FIG. 1 is a photograph of a gallium nitride based light emitting diode.

In this regard, FIG. 1 is a photograph of an entire LED ("die"). In the device of FIG. 1 the passivation layer of silicon dioxide (glass) has been removed except around the outside edge of the die. The portions where glass is still present are generally indicated by the spotted or stained-appearing portions around the perimeter of the generally square die. This mottled appearance results from a varying gap of air under the glass as it delaminates from the die. In the die illustrated in FIG. 1 the delamination begins at about the three o'clock (moving clockwise) and reaches approximately the 11:00 o'clock position. The passivation layer is absent from the center of the die and the wire ball bond can be seen at the very center of the die still attached to the bond pad. In this particular example, the center portion of the passivation layer was removed while the die was being de-encapsulated after testing.

The passivation layer of the die illustrated in FIG. 1 had delaminated in the package during testing, and allowed moisture to penetrate beneath the passivation layer. The resulting delamination reduced the initial light output of this particular device by about 20%. Subsequently the moisture, which tends to permeate through the epoxy lens of an LED lamp and around the leads coming out of the bottom of the lamp package, causes the thin semi-transparent ohmic contact to degrade and eventually fail completely. This failure in turn causes the light output to continue to fall and eventually increase the forward voltage of the device. In the device photographed in FIG. 1, the failure of the contact appears as the dark or rough areas just to the right of the center of the die.

Figure 2:
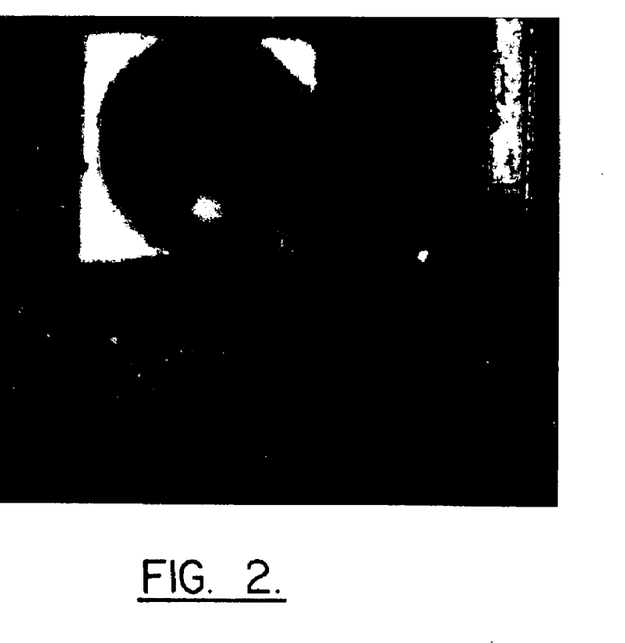
FIG. 2 is a second, somewhat more enlarged photograph of the gallium nitride based light emitting diode of FIG. 1.

FIG. 2 is a magnified view of the die photographed in FIG. 1. FIG. 2 illustrates that the glass remaining on the perimeter has broken off of the inner mesa of the device and that the p-contact has failed. The dark, rough appearing areas are positions where the ohmic contact (titanium and gold in this example) has balled up. As best understood, as the contact becomes less compatible with the p-type layer it tends to bead up rather than wet the p-type layer. In turn, as the Ti/Au balls up around the bond pad, the device slowly becomes disconnected. Furthermore, light is no longer generated in areas where the contact becomes discontinuous. Because a p-type gallium nitride surface is not a good conductor, and generally exhibits high resistivity, the poor current spreading in the void areas fail to provide a current path which would help generate light.

Figure 3:
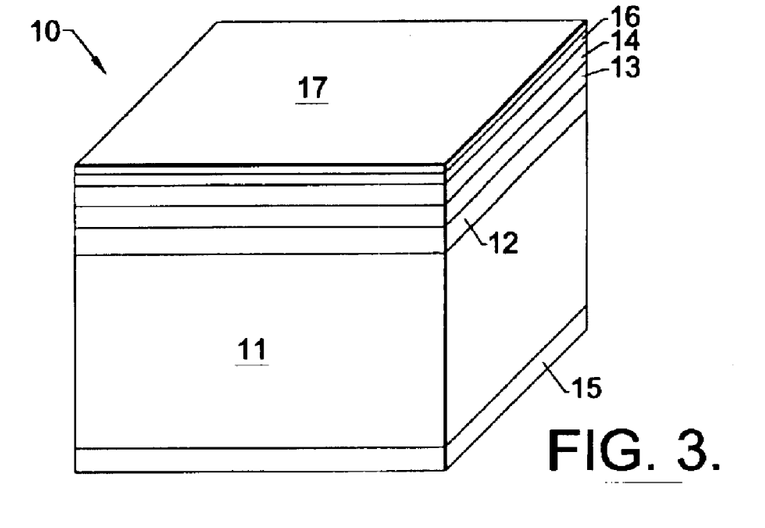
FIG. 3 is a perspective schematic view of an LED according to the present invention.

FIG. 3 illustrates a first embodiment of the diode of the invention that will withstand high temperature and high humidity conditions. The diode is generally designated at 10 and includes a silicon carbide substrate 11, the production and nature of which are clearly set forth in other U.S. patents assigned to assignee of this invention, including for example No. RE 34,861 (formerly No. 4,866,005). In preferred embodiments, the silicon carbide substrate is a single crystal selected from the group consisting of the 3C, 4H, 6H, and 15R polytypes of silicon carbide.

In preferred embodiments, the LED of the present invention further comprises a buffer structure 12 on the silicon carbide substrate 11. The buffer structure helps provide a crystalline and mechanical transition from the silicon carbide substrate 11 to the remaining Group III nitride portions of the device. Appropriate buffer structures are set forth for example in U.S. Pat. Nos. 5,393,993; 5,523,589; and 5,592,501, all of which are commonly assigned with the present invention. Such buffers are also discussed in pending U.S. application Ser. No. 08/436,141; filed May 8, 1995 for "Double Heterojunction Light Emitting Diode with Gallium Nitride Active Layer" which is also commonly assigned with the present invention. The diode 10 further comprises > a Group III nitride heterojunction diode structure 13 with a p-type Group III nitride contact layer 14 on the buffer structure 12. An ohmic contact 15 is made to the substrate 11 and another ohmic contact 16 is made to the p-type gallium nitride epitaxial layer. The ohmic contact 16 is selected from the group consisting of platinum, palladium, gold, a combination of titanium and gold, a combination of platinum and gold, a combination of titanium, platinum and gold, or a combination of platinum and indium tin oxide, and is most preferably formed of platinum or palladium. The device is completed with a passivation layer 17 on the ohmic contact 16, of which appropriate candidate materials are recited above, but that is most preferably formed of silicon nitride.

In preferred embodiments the p-type contact layer is gallium nitride and the ohmic contact is platinum. In the most preferred embodiment, the heterostructure diode is a double heterostructure that includes an n-type gallium nitride epitaxial layer on the buffer structure, an n-type aluminum gallium nitride epitaxial layer on the n-type gallium nitride layer, a compensated n-type gallium nitride active layer on the n-type aluminum gallium nitride layer, and a p-type aluminum gallium nitride layer on the gallium nitride active layer, with a p-type gallium nitride contact layer on the p-type aluminum gallium nitride layer.

Table 1 summarizes these ohmic contact materials in terms of their suitability for devices according to the claimed invention. In the rating scale used in Table 1, "A" refers to superior characteristics, while "C" refers to generally weak characteristics.

TABLE 1

| Property | Contact | | | | | | |
| --- | --- | --- | --- | --- | --- | --- | --- |
| | Pt | Pd | Au | Ti/Au | Pt/Au | Ti/Pt/Au | Pt/ITO |
| Ohmic Characteristics | A | A | B | B | A | B | A |
| Minimal Absorption | B | B | A | A | A | B | A |
| Transparency | B | B | A | A | A | B | A |
| Current Spreading | B | B | A | A | A | A | A |
| Adhesion of the Passivation Layer at 85/85/10 | A | A | B | B | B | B | A |
| Chemical Stability | A | B | B | C | B | B | B |

As illustrated in FIG. 3, in preferred embodiments the ohmic contact 16 covers a substantial portion of the p-type gallium nitride layer to encourage current spreading across the p-type gallium nitride layer. Because it covers the light emitting portions of the device, the ohmic contact 16 is preferably thin enough to be semi-transparent.

In another aspect, the invention comprises a physically robust light emitting diode that includes the p-type contact layer 14, the ohmic contact 16 to the p-type layer 14 and the passivation layer 17, but characterized in that the diode will emit at least 50% of its original optical power and remain substantially unchanged in operating voltage after operating for at least 1000 hours at 10 milliamps in an environment of 85% relative humidity at a temperature of 85° C. These conditions are known as the "85/85/10" test for purposes of determining diode reliability under extreme, yet expected operating conditions.

It will be recognized of course, that even an inferior-quality diode could technically retain 50% of its original (i.e., poor) power. It will thus be understood that in preferred embodiments the original optical power is generally high, for example about 800 microwatts at 20 milliamps of forward current input or even about 1600 microwatt at 20 milliamps of current input. The ability of devices with such output to maintain at least 50% of their original optical power after the 85/85/10 test will be recognized as a significant advance in such diodes.

The diodes illustrated in FIG. 3 can be used in a number of specific applications. One useful application is as a display, typically referred to as "numeric" or "alphanumeric" displays, although certainly not limited to such, that incorporate a plurality of the light emitting diodes according to the invention. In certain embodiments, blue emitting diodes according to the present invention are incorporated with red and green LEDs to form red-green-blue ("RGB") pixels. Because such pixels individually produce the three primary colors, they have the capability to produce almost all colors visible to the human eye.

Figure 4:
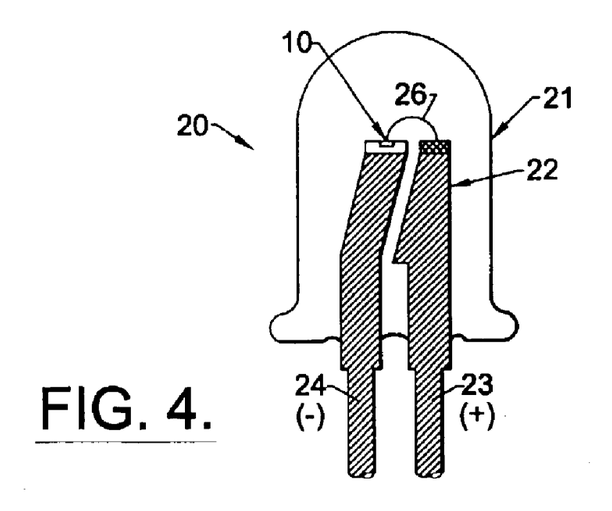
FIG. 4 is a schematic view of an LED lamp that incorporates the diode of the present invention

In other applications, diodes such as the diode 10 illustrated in FIG. 3 are incorporated into LED lamps. FIG. 4 accordingly illustrates one version of such a typical lamp. It will understood, of course, that FIG. 4 is simply exemplary of the type of lamp structure that can be used to incorporate a diode according to the present and is in no sense limiting of the type of lamp with which the diode of the invention can be used.

In FIG. 4, the lamp 20 includes the diode 10 according to the invention encapsulated in a plastic (i.e., polymeric) lens 21. The plastic material for the lens can be selected from a wide variety of polymeric materials that are well known to those of ordinary skill in this art and without undue experimentation. In many circumstances, the lens 21 is formed of an epoxy resin. The lamp 20 further comprises a metal lead frame 22 for electrically connecting the lamp to other electronic circuit elements. As illustrated in FIG. 4, the metal lead frame 22 incorporates the anode 23 and the cathode 24.

As in the diode embodiment of the invention, a plurality of the lamps 20 can be incorporated to form an appropriate display device. In particular, because gallium nitride devices of this type emit in the blue portion of the visible spectrum, lamps such as those according to the present invention can be advantageously incorporated along with red and green LED lamps to form a full color display. Examples of such displays are set forth in for example, co-pending and commonly assigned applications Ser. No. 08/580,771, filed Dec. 29, 1995, for "True Color Flat Panel Display Module;" and Ser. No. 08/631,926, filed Jun. 10, 1996 for "LED Dot Matrix Drive Method and Apparatus."

Figure 5:
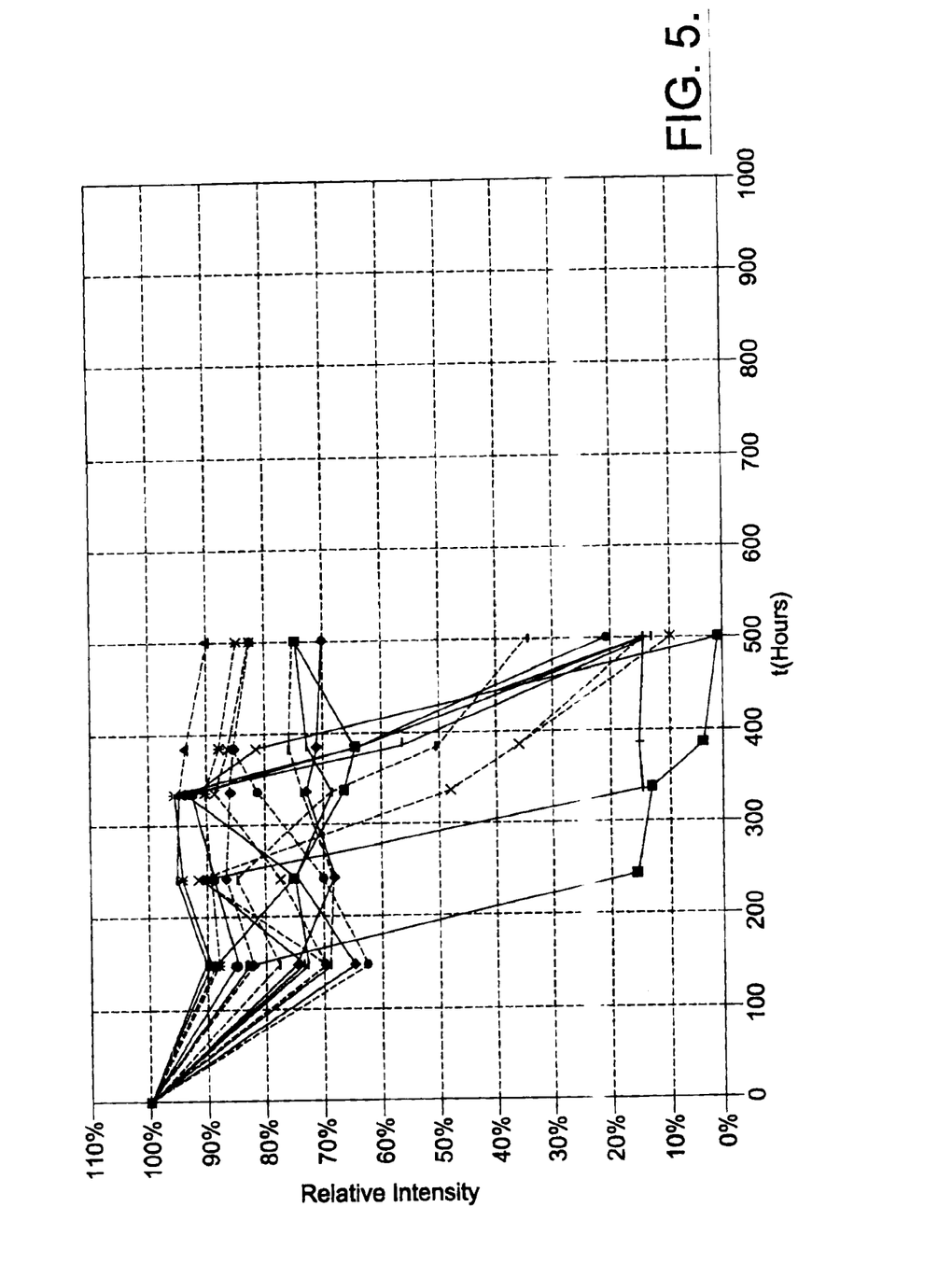
FIG. 5 is a plot of relative intensity versus time for certain Group III nitride diodes under 85/85/10 conditions.
Figure 6:
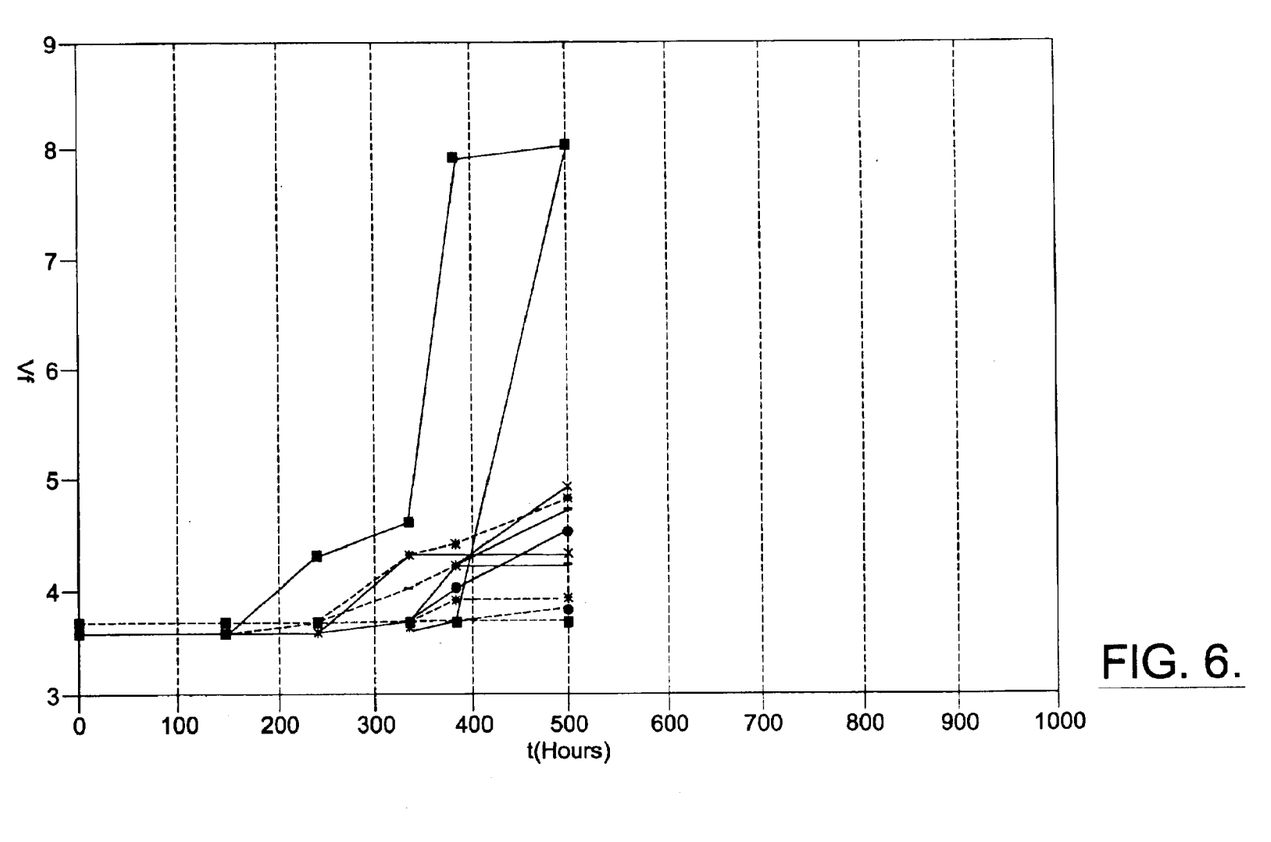
FIG. 6 is a plot of forward voltage ($V_f$) versus time for certain Group III nitride diodes under 85/85/10 conditions.

FIGS. 5–8 plot some comparative data that highlights the advantages of the present invention. FIG. 5 plots relative intensity (i.e. the starting intensity of each diode is considered to be 100%) versus time for certain Group III nitride diodes under the aforementioned 85/85/10 test conditions. FIGS. 5 and 6 reflect data from diodes with p-type gallium nitride (GaN) contact layers, titanium/gold ("Ti/Au") ohmic contacts, and silicon dioxide ($SiO_2$) passivation layers.

As FIG. 5, illustrates, the diodes begin to degrade immediately, with some dropping below 50% of their original intensity in less than 200 hours. FIG. 6 plots forward voltage ($V_f$) versus hours for the same diodes under the same conditions as in FIG. 5 and demonstrates that a substantial number of the diodes have significantly degraded within 500 hours.

Figure 7:
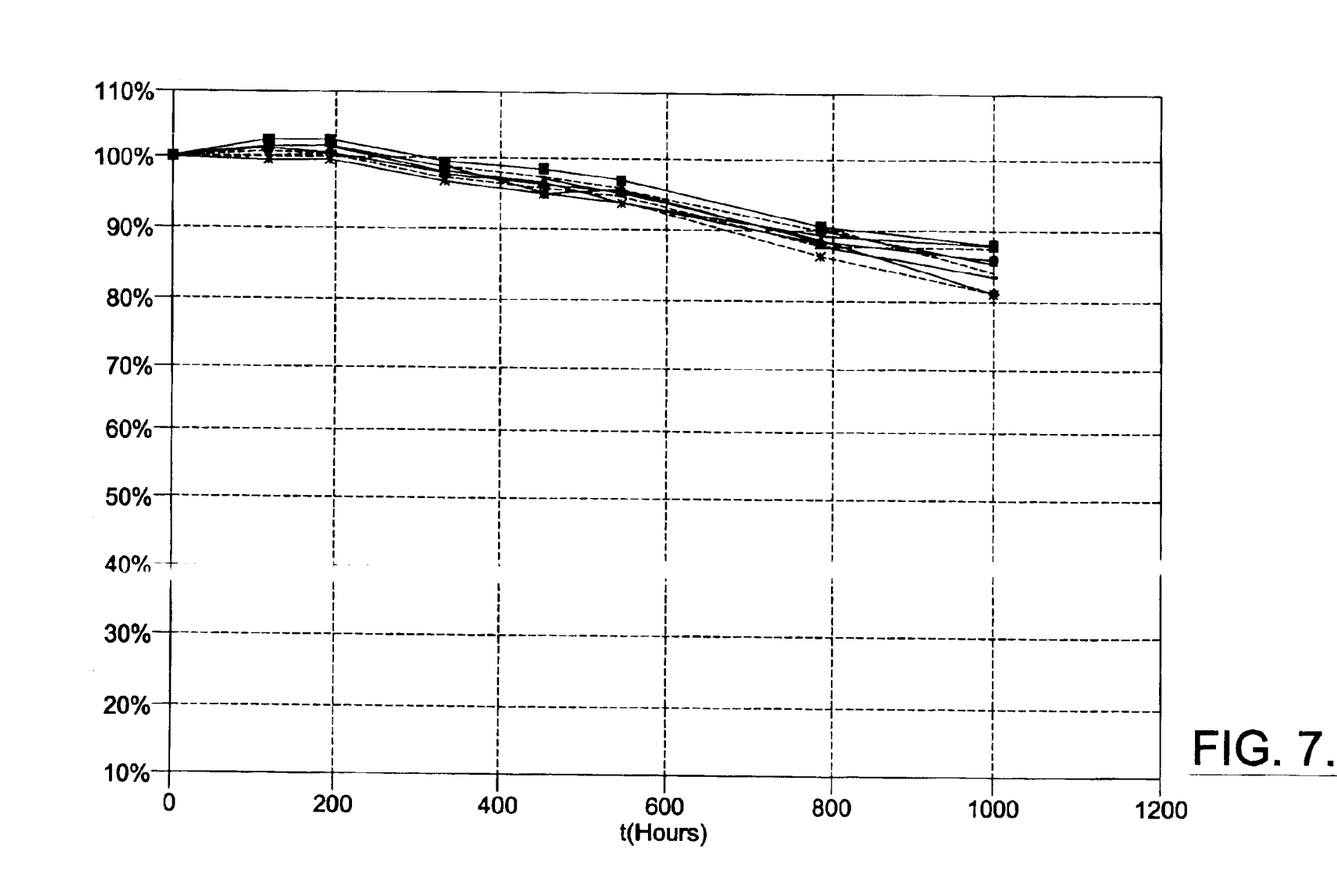
FIG. 7 is a plot of relative intensity versus time for diodes according to the present invention under 85/85/10 conditions.
Figure 8:
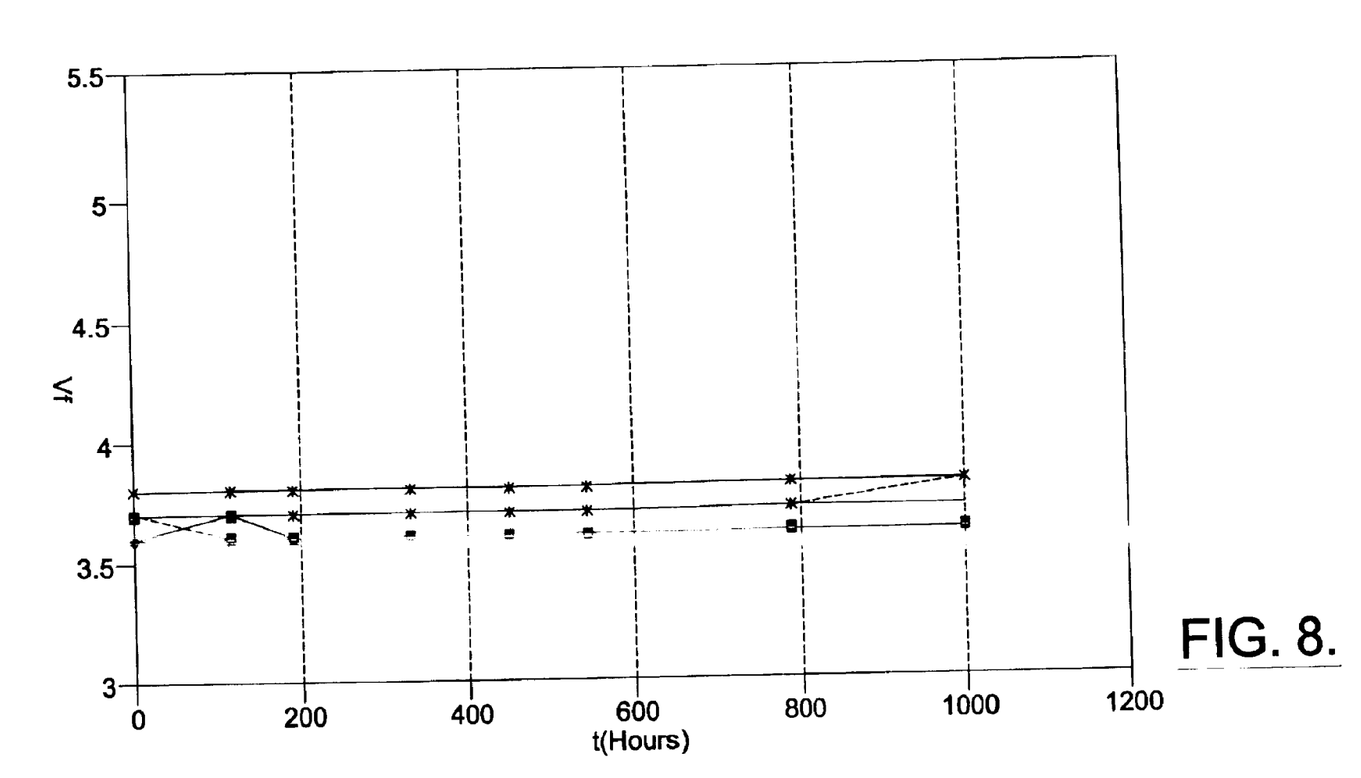
FIG. 8 is a plot of forward voltage ($V_f$) versus time for diodes according to the present invention under 85/85/10 conditions.

FIGS. 7 and 8 highlight some of the advantages of diodes according to the present invention, and includes diodes with p-type GaN contact layers, platinum (Pt) ohmic contacts, and silicon nitride ($Si_3N_4$) passivation layers. With respect to relative intensity, all of the tested diodes (nine are represented in FIGS. 7 and 8) maintained at least 80% of their original intensity after 1000 hours under 85/85/10 conditions. With respect to $V_f$, none showed significant changes even after 1000 hours under the test conditions.

In the drawings and specification, there have been disclosed typical embodiments of the invention, and, although specific terms have been employed, they have been used in a generic and descriptive sense only and not for purposes of limitation, scope of the invention being set forth in the following claims.

What is claimed is:

1. A high-reliability light emitting diode that will withstand high temperature and high humidity conditions, said diode comprising:

a silicon carbide substrate;

a buffer structure on said substrate;

a Group III nitride heterojunction diode with a p-type Group III nitride contact layer on said buffer structure;

an ohmic contact to said substrate;

a platinum ohmic contact to said p-type contact layer; and a silicon nitride passivation layer on said platinum ohmic contact.

2. A high reliability light emitting diode according the claim 1 wherein said diode comprises a single heterojunction diode.

3. A high reliability light emitting diode according to claim 1 wherein said diode comprises a double heterojunction diode.

4. A high reliability light emitting diode according to claim 1 wherein said contact layer comprises gallium nitride.

5. A high reliability light emitting diode according to claim 1 wherein said ohmic contact covers a substantial portion of said p-type contact layer to encourage current spreading across said p-type contact layer.

6. A high reliability light emitting diode according to claim 1 wherein said ohmic contact is thin enough to be semi-transparent.

7. A display comprising a plurality of light emitting diodes according to claim 1.

8. A pixel comprising:

a light emitting diode according to claim 1 that emits in the blue portion of the visible spectrum;

a red light emitting diode; and a green light emitting diode.

9. A display comprising a plurality of pixels according to claim 8.

10. A high reliability light emitting diode according to claim 1 that will emit at least 50% of its original optical power and remain substantially unchanged in operating voltage after operating for at least 1000 hours at 10 miliamps in an environment of 85% relative humidity at a temperature of 85 C.

11. A high reliability light emitting diode according to claim 10 wherein the original optical power is about 800 microwatts at 20 milliamps of forward current input.

12. A high reliability light emitting diode according to claim 10 wherein the original optical power is about 1600 microwatts at 20 milliamps of forward current input.

13. A high reliability light emitting diode according to claim 1 wherein said silicon carbide substrate is a single crystal selected from the group consisting of the 3C, 4H, 6H, and 15R polytypes of silicon carbide.

14. An LED lamp comprising:

a plastic lens; and a light emitting diode;

said light emitting diode comprising,
      a silicon carbide substrate, a buffer structure on said substrate;

a Group III nitride heterojunction diode with a p-type Group III nitride contact layer;

an ohmic contact to said substrate;

a platinum ohmic contact to said p-type contact layer; and a silicon nitride passivation layer on said platinum ohmic contact.

15. A high reliability light emitting diode according to claim 14 wherein said ohmic contact covers a substantial portion of said p-type contact layer to encourage current spreading across said p-type contact layer.

16. A high reliability light emitting diode according to claim 14 wherein said ohmic contact is thin enough to be semi-transparent.

17. A display comprising a plurality of light emitting diodes according to claim 14.

18. A display according to claim 17 wherein said light emitting diodes emit in the blue portion of the visible spectrum, and further comprising a plurality of red light emitting diodes and a plurality of green light emitting diodes.

19. A high reliability light emitting diode according to claim 14 wherein said silicon carbide substrate is a single crystal selected from the group consisting of the 3C, 4H, 6H, and 15R polytypes of silicon carbide.

20. A high reliability light emitting diode according to claim 14 wherein said contact layer comprises gallium nitride.

21. A high reliability light emitting diode according to claim 14 wherein said diode comprises a single heterojunction diode.

22. A high reliability light emitting diode according to claim 14 wherein said diode comprises a double heterojunction diode.

23. A high-reliability light emitting diode that will withstand high temperature and high humidity conditions, said diode comprising:

a silicon carbide substrate;

a buffer structure on said substrate;

an n-type gallium nitride epitaxial layer on said buffer structure;

an n-type aluminum gallium nitride epitaxial layer on said gallium nitride layer a compensated n-type gallium nitride active layer on said n-type aluminum gallium nitride active layer;

a p-type aluminum gallium nitride layer on said gallium nitride active layer;

a p-type gallium nitride contact layer on said p-type aluminum gallium nitride layer;

an ohmic contact to said substrate;

a platinum ohmic contact to said p-type gallium nitride contact layer; and a silicon nitride passivation layer on said platinum ohmic contact.

* * * * *